(12) United States Patent
Campbell et al.

(10) Patent No.: US 8,129,215 B1
(45) Date of Patent: Mar. 6, 2012

(54) METHOD FOR PRODUCING HIGH TEMPERATURE THIN FILM SILICON LAYER ON GLASS

(76) Inventors: James P Campbell, Atherton, CA (US); Harry R Campbell, Los Gatos, CA (US); Ann B Campbell, Los Gatos, CA (US); Joel F Farber, San Jose, CA (US)

(*) Notice: Subject to any disclaimer, the term of this patent is extended or adjusted under 35 U.S.C. 154(b) by 0 days.

(21) Appl. No.: 13/078,916

(22) Filed: Apr. 1, 2011

(51) Int. Cl.
*H01L 21/00* (2006.01)
*H01L 21/20* (2006.01)

(52) U.S. Cl. ......... 438/97; 438/149; 438/166; 438/478; 438/486; 438/488; 257/19; 257/64; 257/72; 257/351; 257/E21.413; 257/E27.081; 257/E27.082

(58) Field of Classification Search .......... 438/97, 438/149, 166, 478, 486, 488; 257/19, 64, 257/72, 351, E21.413, E27.081, E27.082
See application file for complete search history.

(56) References Cited

U.S. PATENT DOCUMENTS

| | | | |
|---|---|---|---|
| 4,206,252 A | 6/1980 | Gordon | |
| 4,227,942 A | 10/1980 | Hall | |
| 4,294,193 A | 10/1981 | Gordon | |
| 4,440,822 A | 4/1984 | Gordon | |
| 4,927,770 A | 5/1990 | Swanson | |
| 5,192,991 A | 3/1993 | Hosokawa | |
| 5,667,597 A | 9/1997 | Ishihara | |
| 5,770,495 A | 6/1998 | Sato et al. | |
| 6,111,191 A | 8/2000 | Hall et al. | |
| 6,180,871 B1 | 1/2001 | Campbell et al. | |
| 6,204,519 B1 | 3/2001 | Yamazaki et al. | |
| 6,255,203 B1 | 7/2001 | Cheng et al. | |
| 6,320,117 B1 | 11/2001 | Campbell et al. | |
| 6,420,643 B2 | 7/2002 | Ford et al. | |
| 6,509,204 B2 * | 1/2003 | Campbell | 438/97 |
| 6,602,606 B1 | 8/2003 | Fujisawa et al. | |
| 6,977,192 B2 | 12/2005 | Yamazaki et al. | |
| 7,091,411 B2 | 8/2006 | Falk et al. | |
| 7,135,350 B1 | 11/2006 | Smith et al. | |
| 7,153,770 B2 | 12/2006 | Choi | |
| 7,173,282 B2 | 2/2007 | Yamazaki et al. | |
| 7,192,818 B1 | 3/2007 | Lee et al. | |
| 7,456,428 B2 * | 11/2008 | Hatano et al. | 257/64 |
| 7,468,485 B1 | 12/2008 | Swanson | |
| 7,498,058 B2 | 3/2009 | Harris et al. | |
| 7,592,198 B2 | 9/2009 | Huet et al. | |
| 7,633,006 B1 | 12/2009 | Swanson | |
| 7,679,087 B2 | 3/2010 | Yamazaki et al. | |
| 7,759,051 B2 * | 7/2010 | You | 430/321 |
| 7,803,699 B2 | 9/2010 | Jeong et al. | |
| 7,812,250 B2 | 10/2010 | Smith | |

(Continued)

OTHER PUBLICATIONS

Wang, Yangyoan et al. "Super Thin-Film Transistor with SOI CMOS Performance Formed by Novel Grain Enhancement Method" IEEE Transactions on Electron Devices, vol. 47, No. 8, Aug. 2001.

(Continued)

*Primary Examiner* — Dao H Nguyen

(57) ABSTRACT

A method for producing a High Temperature Thin Film Layer On Glass (HTTFLOG) of silicon, which is a precursor component of thin film transistors (TFTs). The invention described here is a superior method of fabricating HTTFLOG precursor structures or components for liquid crystal displays (LCDs) with quicker production time and lower cost of manufacture while enabling a groundbreaking increase in small and large screen resolution. This invention is a new subassembly intended for original equipment manufacturer (OEM) consumption and inclusion in display products.

6 Claims, 4 Drawing Sheets

U.S. PATENT DOCUMENTS

| | | | |
|---|---|---|---|
| 7,863,157 B2 | 1/2011 | Henley et al. | |
| 2001/0046755 A1* | 11/2001 | Hara et al. | 438/488 |
| 2003/0013280 A1* | 1/2003 | Yamanaka | 438/487 |
| 2009/0162966 A1 | 6/2009 | Jawarani et al. | |

OTHER PUBLICATIONS

Park, Joong Hyun "High Temperature Crystallized Poly-Si on Molybdenum Substrates for Thin Film Application" Solid State Phenomena, V93 (2003), pp. 13-18.

Plasma Quest Ltd, "Low Cost Thin Film Poly-Silicon Solar Cells" FES S/P2/00413/00/00/REP DTI/Pub URN 05/700, first published 2005, UK, http://www.greencollareconomy.com/option,com_docman/task,doc_download/gid,43/Itemid,349/.

Bergman, R.B. et al. "The Future of Crystalline Silicon Films on Foreign Substrates" Thin Solid Films 4003-4004 (2002) 162-169, Elsevier Science, PII S0040-6090(01)01556-5.

Dassow, R. et al. "Laser Crystallization of Silicon for High-performance Thin-film Transistors" Semiconductor Science Technology 15 (2000) L31-L34 PII: S0268-1242(00)13968-9, UK.

Sinton, Ronald A. et al. "Simplified Backside Contact Solar Cells" IEEE Journal, Feb. 1990, pp. 348-352.

Besore, Paul A. "Large-Area Deposition for Crystalline Silicon on Glass Modules" Presented at 3rd World Conference on Photovoltaic Energy Conversation, Osaka, JP, May 2003.

* cited by examiner

METHOD FOR PRODUCING HIGH TEMPERATURE THIN FILM SILICON LAYER ON GLASS

BACKGROUND OF THE INVENTION

The present invention relates generally to producing a High Temperature Thin Film Layer On Glass (HTTFLOG) of silicon, which is a precursor component of thin film transistors (TFTs) or other electronic devices. The term thin film is used in this invention to describe layers of less the 50 microns thickness.

The invention described here is a superior method to fabricate HTTFLOG precursor structures or components for electronic devices, including liquid crystal displays (LCDs). These displays have quicker production time and lower cost of manufacture, while enabling a groundbreaking increase in small and large screen resolution. The invention described here is a new sub-assembly intended for original equipment manufacturer (OEM) consumption and inclusion in electronic products.

One of the inventors of the present invention has patents directed toward semiconductor poly-silicon solar cells (U.S. Pat. Nos. 6,180,871, 6,320,117, 6,509,204). These patents describe a structure that includes a p-n junction diode. The p+ and n− polycrystalline silicon structures making up the PIN junction are formed using an Excimer laser. An advantage of using the Excimer laser (XeCl) is that it may form the polycrystalline silicon without destroying a low melting point substrate upon which the solar cell is fabricated.

The present invention teaches an efficient method of component manufacture based on incorporating the HTTFLOG fabrication into the widely used, high temperature, Float Glass and other comparable glass manufacture processes, without the need for the Excimer or other comparable laser.
Background on the Float Glass Process The flat glass industry and its primary products are classified under Standard Industrial Classification (SIC) 3211. Among the products included are flat building glass, cathedral glass, float glass, antique glass, sealed insulating glass units, laminated glass made from glass produced in the same establishments, picture glass, plate glass (rough or polished), skylight glass, flat structural glass, tempered glass, window glass, etc.

In the Float Glass process, the batch raw materials are melted in very large furnaces and the exiting molten glass is "poured" onto a pool of molten tin. A continuous ribbon of glass is then drawn from this spreading mass.
Prior Art The low temperature thin film silicon layer forming process, commonly called the low temperature approach (LTP-STFT, low temperature poly-silicon TFT) in the industry is normally limited to 450° Celsius. This is a temperature limit that is commonly recognized within the industry. The temperature range limit is used in order to not melt or distort the substrate surfaces.

Both the prior art low temperature approach and the high temperature approach, HTTFLOG introduced here, can form precursors for transistors, solar cells, and other devices with polycrystalline silicon (poly-silicon). As is well known in the art, polycrystalline silicon can be formed by heating silicon to its melting point and allowing it to cool. Typically, silicon begins to crystallize after it melts at temperatures greater than about 1400° C. and begins to cool below that level. High temperature processes are not appropriate for substrates made of plastics or other materials that melt at low temperatures.

One important element in the cost/performance formula in the manufacture of thin film transistor (TFT) or other electronic devices is the use of silicon. Presently, cost/performance tradeoffs have led to two approaches in the industry for the makeup of the devices. One is amorphous silicon (a-Si) and the other is polycrystalline silicon (pc-Si).

Amorphous silicon can be deposited using low temperature processes. It can be deposited and formed on plastic and other flexible substrates and also be formed over large surfaces. This processing technique is less expensive than a poly-silicon process. Nevertheless, amorphous silicon transistors introduce other significant limitations not found in crystalline silicon or polycrystalline silicon transistors. For example, hydrogen is generally added during the manufacturing to increase the efficiency. However, amorphous silicon transistors tend to lose this hydrogen over time, causing reduced efficiency and reduced usable life.

Pc-Si is by far the preferred technical solution because of the speed and performance of the transistor. A-Si is still used (but diminishing) because it produces lower performance transistors, but they are historically less expensive to manufacture.

The low temperature approach for pc-Si normally uses laser annealed a-Si to get the best performance, but it is an expensive approach. There is a niche market in which it is necessary: LCD projection and small display devices for cameras, cell phones, iPads, and electronic tablets. These employ small high-resolution displays which are made by low-temperature methods today. Amorphous silicon displays today have not generally achieved the very high resolutions wanted for these devices by the marketplace.

In the manufacture of flat panel displays, it is common to use Excimer lasers to form polycrystalline silicon thin film transistors, so as not to distort the substrate. Laser annealing is an effective method of precisely melting the silicon layer without damaging the substrate, but it has other drawbacks.

Laser annealing, with Excimer laser type, equipment, is an expensive undertaking because it requires a large vacuum chamber, about 3 meters square, with interlocked entrance and exit apertures, and an internal moving stage. This is complex, sensitive, power hungry, and manpower intensive equipment. The exact positioning of the laser beam is unforgiving, and these lasers don't last long requiring maintenance, production downtime, and replacement.

Silicon has an energy absorption peak at about 308 nm wavelength. When using an Excimer laser it requires a very short pulse of about 45 nanoseconds to melt the thin film of silicon without heating the underlying glass substrate. This may be pulsed in the 30 Hz/sec. range.

Processing time is an important consideration in production cost. An Excimer laser is usually stepped over the surface, in small increments, generally at a rate of about 30 pulses per second. These steps are usually overlapped. They operate this way, and not more rapidly, to avoid overheating the substrate. They achieve accurate localized heating. The number of steps required when using a laser, the cycle time, and the material and tool handling considerations increase the expenses involved in the use of the low temperature pc-Si approach. In addition, the low temperature method of stepping the laser over the same area repeatedly causes fairly wide variations in the thin film poly-silicon surface. This results in wide variations in final transistor performance. Beta, the speed of the transistors, sometimes has a variation of 50%.

Current flat panel screens are of limited resolution. Most in the marketplace today are in the 200 pixels per inch (ppi) range. The very best in the marketplace today is 326 ppi, in the Apple Iphone 4. The screen in that device is small, measuring about four inches long. This screen resolution is an advertised technology leadership feature by Apple, as a significant market advantage.

An alternative to the low temperature pc-Si approach is the high temperature pc-Si approach, introduced in this invention.

SUMMARY OF THE INVENTION

The invention described here, a high temperature thin film layer on glass (HTTFLOG) of silicon, is a superior method to fabricate precursor components for liquid crystal displays (LCDs) with quicker production time and lower cost of manufacture, while providing increases in screen resolution for large and small screen sizes. The methods employed comprise depositing fine grains of poly-silicon on a very hot glass substrate without the need for expensive laser annealing. Thus HTTFLOG is a novel method of fabrication that avoids prior art technical problems and high costs of manufacture.

The basis of the HTTFLOG process is the incorporation of the fabrication of the precursor component to thin film transistors into the Float Glass process. Piggybacking the HTTFLOG manufacturing onto the Float Glass process has many advantages, including that it can be a direct replacement for the more energy intensive and costly, low temperature fabrication methods used today, thus providing a more cost effective process.

In the HTTFLOG, the high temperature process described in this invention, Flash Lamps or equivalents are employed to accomplish the poly-silicon layer annealing to produce transistor precursor structures. This both reduces cost and improves cycle time. This method can be applied to a large substrate surface, a stripe the width of the hot flowing glass, in a continuous flow process, or multiple steps. This is not in common use today.

The Flash Lamps are employed to raise the temperature of the thin film being formed to the melting point of the silicon without significantly disturbing the substrate surface because the substrate is already very hot, in the range of 700° C. In this temperature range, applying the minimum energy necessary to melt and anneal the poly-silicon avoids distortion of the underlying substrate, resulting in fewer defects and better HTTFLOG quality. Efficient Flash Lamp annealing is also known as Rapid Thermal Annealing (RTA).

When employing Flash Lamps in the HTTFLOG method the substrate temperature may be elevated about an additional 100° C., without substrate damage, while the temperature of the silicon layer is raised to its melting point of about 1400° C. This allows the use of much longer flash lamp pulses compared to an Excimer type laser, of about 1-4 microseconds. It also allows for more rapid pulsing of the lamps in the 1K Hz/sec. range. The Flash Lamp system includes the 308 nm wavelength absorption peak of silicon and other UV wavelengths that are additive to the melting process. The precise 308 nm wavelength is not necessary to melt the silicon thin film to its 1400° C. melting point. Utilization of Flash Lamps comprises a less expensive and complex fabrication method than employing lasers. Other heat/energy sources could also be employed.

When the silicon is raised to its melting point and the rate of cooling is properly controlled, the resulting ratio of crystal diameter to thickness can be optimized to a ratio of 10:1 or better. Grain size diameter to thickness is defined as grain size ratio. The grain size ratio in these large grains is equal to about one half micron in diameter which can be used to form faster transistors with Betas of greater than 400 cm/sec. Faster and smaller transistors provide the ability to produce a larger number of pixels per area, thus allowing larger high resolution displays to be fabricated. The method in this invention supports resolutions of greater than 600 ppi.

Another desirable characteristic of the Float Glass process is that it provides a slow moving continuous flow substrate for device fabrication. Fabricating while the glass is already hot also further reduces the total energy required to produce a HTTFLOG device and thus further reducing its cost.

Deliberate control of the cooling in the Float Glass process is superior to that on the low temperature process in part because the temperature of the substrate starts approximately 300° C. higher. With controlled cooling, more precision can be exercised, increasing the grain size ratio. In this invention a step is introduced into the HTTFLOG process to control the rate of cooling of the poly-silicon which in turn improves the rate of crystallization. A post annealing step of continuous wave ultraviolet radiation may be employed to further increase crystal size.

This HTTFLOG process comprises annealing silicon at high temperatures to form a thin film of polycrystalline silicon (pc-Si) on hot glass. Many forms of silicon may be employed. Amorphous and especially forms of finely ground poly-silicon are suitable. In most HTTFLOG embodiments fine ground poly-silicon is preferred.

When the term silicon is used throughout this invention description, it is intended to be inclusive of undoped and doped silicon at varying levels and types of dopant as suits the need of the particular transistor precursor structure being fabricated. Dopant levels are adjusted to suit the application needs.

The finely ground poly-silicon grains which can be employed in HTTFLOG are very small, with diameters usually below 100 nm. Finely ground poly-silicon can be sprayed onto the substrate evenly and very economically. This forms a layer which, after annealing, results in a film with a thickness in the range of about 3 nm-50 microns. This form of silicon has the additional advantage of easily being predoped.

The annealing and cooling process of the film forms a poly-silicon layer having large grain size ratios. The theoretical target for this process is to have each grain, or a small number of grains, become one transistor in a final TFT product. Grain size ratios of approximately 10 to 1 or more are the target for this invention. So an approximately 50 nm thick film has grain size diameter of about 500 nm.

Because of the characteristics of the resulting poly-silicon film formed by HTTFLOG, it allows the production of very fast transistors with an excellent Beta, in approximately the 300-600 cm/sec. range. Because of the uniformity of the heat application from Flash Lamps, generally about a 5% variation in heat application, the uniformity of the Beta is more consistent using the HTTFLOG process, hence allowing the production of higher quality displays with fewer areas of degradation.

Another advantage of HTTFLOG is that it does not depend on hydrogen as a carrier. So transistors produced by this HTTFLOG method do not suffer from the efficiency loss that amorphous silicon transistors do. Thus, their lifetime is extended over that of amorphous transistors, and they maintain superior performance.

While the description here employs the Float Glass process, this device fabrication can be combined into other high heat glass manufacture processes such as the Corning Fusion and Gorilla Glass systems, or Asahi Dragontrail glass, etc. These continuous high heat flow glass production processes may be augmented to produce the devices described in this invention and other devices.

When the term glass is used throughout this invention description, it is intended to be inclusive of most glass types and varieties. Non-sodium glass is employed in most embodiments of this invention.

The novelty of this invention is comprised of a unique fabrication method employing the high temperature Float Glass process or other process having a high temperature substrate, efficient Flash Lamp rapid thermal annealing, controlled cooling, and the use of sprayed on finely ground poly-silicon all resulting in a thin film polycrystalline layer with large grain size ratio which results in faster transistor speed, faster production cycle time, reduced cost, improved process reliability and quality, and record setting levels of display resolution.

DESCRIPTION OF THE EMBODIMENTS

Figure 1:
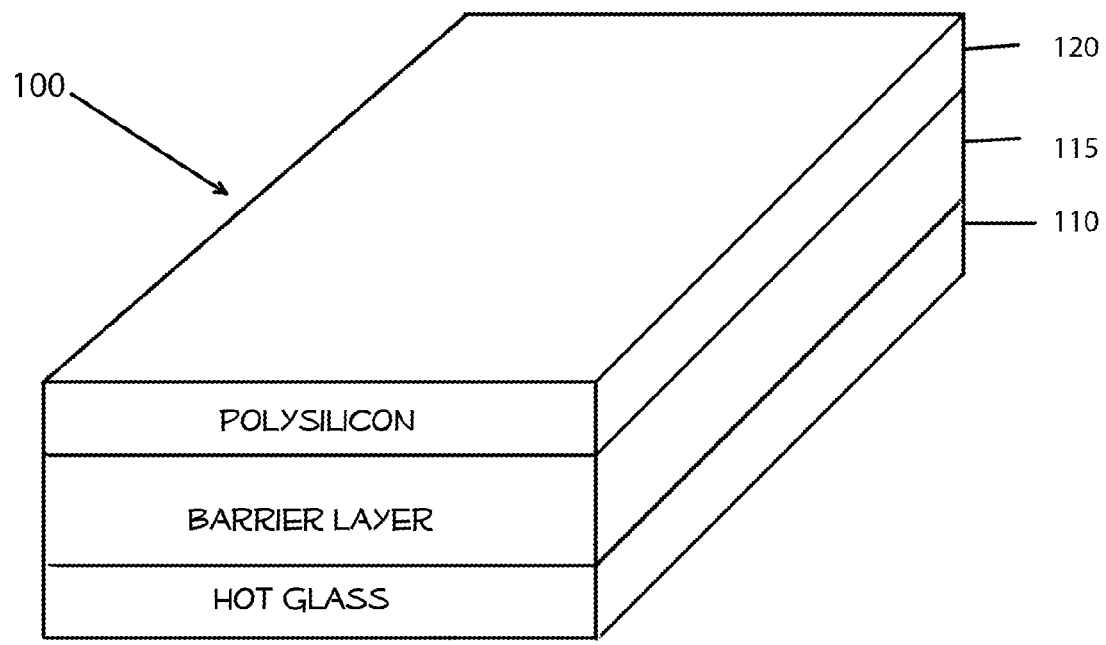
FIG. 1 is a cross-sectional diagram of high temperature thin film layer on glass (HTTFLOG) poly-silicon according to the present invention.

All numbers expressing dimensions, physical characteristics, quantities of ingredients, reaction conditions, and the like used in the specification and claims are to be understood as being modified in all instances by the term "about". Accordingly, unless indicated to the contrary, the numerical values set forth in the following specification and claims may vary depending upon the desired properties sought to be obtained by the present invention. At the very least, and not as an attempt to limit the application of the doctrine of equivalents to the scope of the claims, each numerical parameter should at least be construed in light of the number of reported significant digits and by applying ordinary rounding techniques. Moreover, all ranges disclosed herein are to be understood to encompass any and all sub-ranges subsumed therein. For example, a stated range of "1 to 10" should be considered to include any and all sub-ranges between (and inclusive of) the minimum value of 1 and the maximum value of 10; that is, all sub-ranges beginning with a minimum value of 1 or more and ending with a maximum value of 10 or less, e.g., 1.0 to 7.8, 3.0 to 4.5, 6.3 to 10.0.

As used herein, spatial or directional terms, such as "left", "right", "inner", "outer", "above", "below", "top", "bottom", and the like, are understood to encompass various alternative orientations and, accordingly, such terms are not to be considered as limiting.

As used herein, the terms "on", "applied on/over", "formed on/over", "deposited on/over", "overlay" and "provided on/over" mean formed, deposited, or provided on but not necessarily in contact with the surface. For example, a coating layer "formed over" a substrate does not preclude the presence of one or more other coating layers of the same or different composition located between the formed coating layer and the substrate. For instance, the substrate can include a conventional coating such as those known in the art for coating substrates, such as glass or ceramic.

As used herein, the term "coating" refers to one or more layers. Each layer can be made up of one or more "films".

In one non-limiting embodiment, the method of the present invention comprises depositing an undercoating layer over at least a portion of the substrate and depositing a functional coating over at least a portion of the undercoating layer.

According to the present invention, the steps of depositing the layers can be accomplished using conventional application techniques such as chemical vapor deposition ("CVD"), spray pyrolysis, and magnetron sputtered vacuum deposition ("MSVD") as are well known in the art. Other well-known deposition techniques such as plasma enhanced CVD ("PECVD") and plasma assisted CVD ("PACVD") and others may also be utilized in the present invention.

One embodiment of the present invention provides a method for fabricating HTTFLOG components by applying an optional barrier layer to glass while it is still hot during the Float Glass process followed by a thin layer of silicon. While the glass is still hot, the thin layer of silicon is annealed to produce poly-silicon with a large grain size ratio. The method comprises applying a silicon layer overlaying the substrate and/or the optional barrier layer, then converting the silicon layer into polycrystalline silicon by the application of thermal or ultraviolet or other energy. Xenon flash lamps or similar devices may be used for applying the energy, followed by controlled cooling of the structure.

FIG. 1 is a cross-sectional diagram of this embodiment of HTTFLOG component 100 according to the present invention. HTTFLOG 100 has a substrate layer 110 providing a base for the HTTFLOG component. Substrate layer 110 may be glass during the Float Glass process while the glass is still hot. An optional barrier layer 115 may overlay the substrate. An undoped or n-doped silicon layer 120 overlays the substrate 110 or, optionally, the barrier layer 115.

Figure 2:
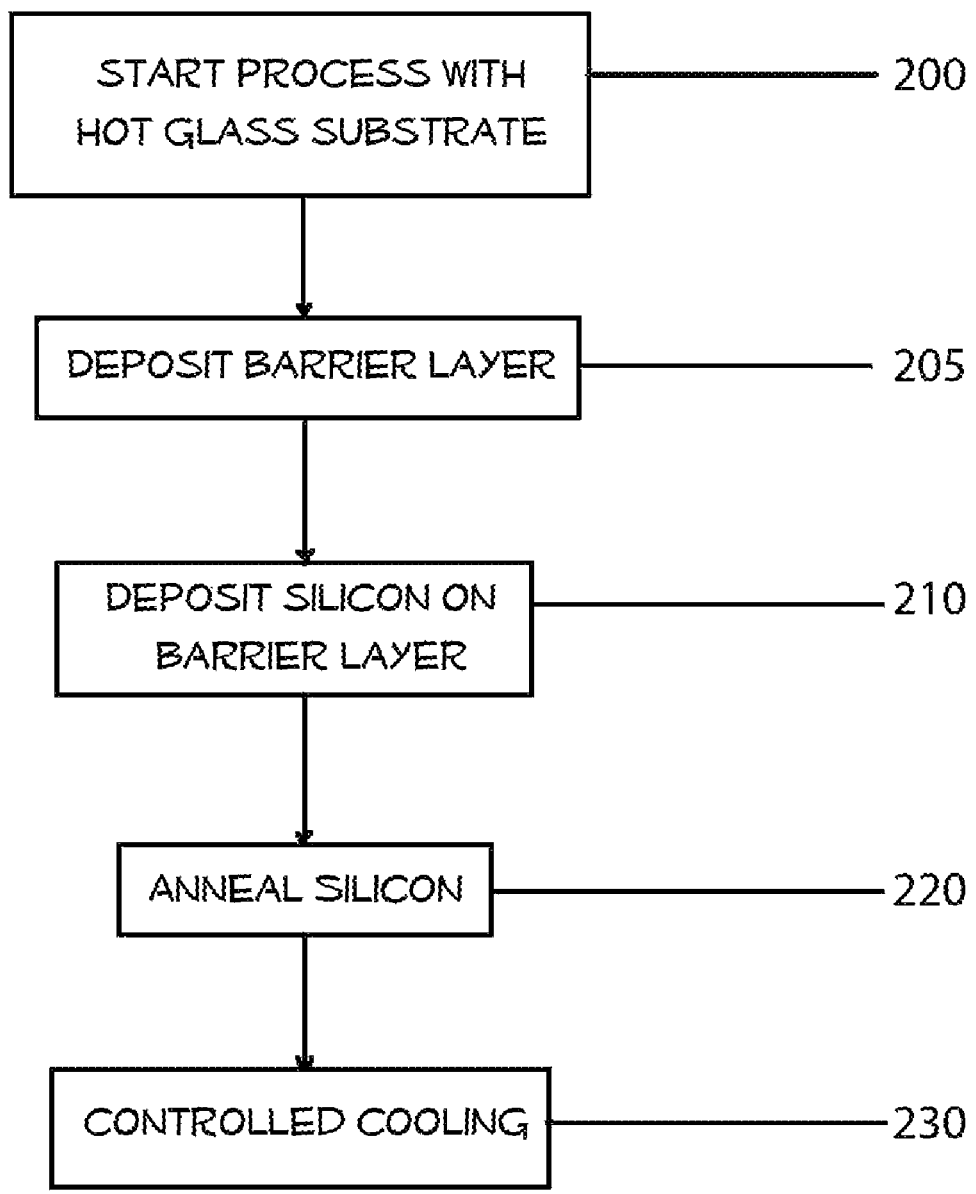
FIG. 2 is a flow diagram showing a method of fabricating high temperature thin film layer on glass (HTTFLOG) poly-silicon according to the present invention.

FIG. 2 shows a flow diagram of a method of fabricating HTTFLOG 100 according to the present invention. While FIG. 2 shows a specific embodiment, it is not intended that this be the only way such an HTTFLOG component may be fabricated. One of skill in the art will recognize that other variations of the invention are readily apparent from the specific embodiment described herein.

Referring to flow diagram FIG. 2, in step 200 a suitable substrate 110 is provided upon which HTTFLOG component 100 may be fabricated. In this embodiment the substrate is float glass. Significantly, glass during the Float Glass manufacturing process allows the heat required to crystallize amorphous or ground poly-silicon to be applied without damaging the glass substrate, due to the molten or plastic state of the glass. One of skill in the art will recognize many acceptable materials which can be heated to temperatures above 500° C. or more for substrate 110 and any may be used without departing from the present invention. In step 205 an optional barrier layer 115 may be deposited by spraying or other deposition method overlaying the substrate 110. Depending upon the embodiment, substrate 110 may be coated with a variety of materials. One reason for coating would be to avoid poisoning the silicon by employing a barrier layer, which may be required depending on the specific chemical composition of the glass needed for the application.

In step 210, a silicon layer 120 is formed by spraying or other deposition method overlaying the substrate 110. The silicon layer 120 preferably has a thickness of about 5 nm to 1 micron in this specific embodiment.

In step 220, the silicon layer 120 is annealed using rapid thermal annealing using xenon flash lamps, or other heat/energy sources, resulting in a polycrystalline structure.

Step 230 provides controlled cooling of the poly-silicon structure created by step 220 in order to form the optimum crystalline structure. The resulting structure is optionally patterned. A protective layer may be applied to the HTTFLOG component during or following cooling in order to protect the surface until the component undergoes further processing.

Another embodiment would entail optional coatings such as barrier layer 115, and a thicker layer 120 of silicon, providing a precursor suitable for fabrication of electronic devices such as solar cells and panels with selective-area back contacts.

Figure 3:
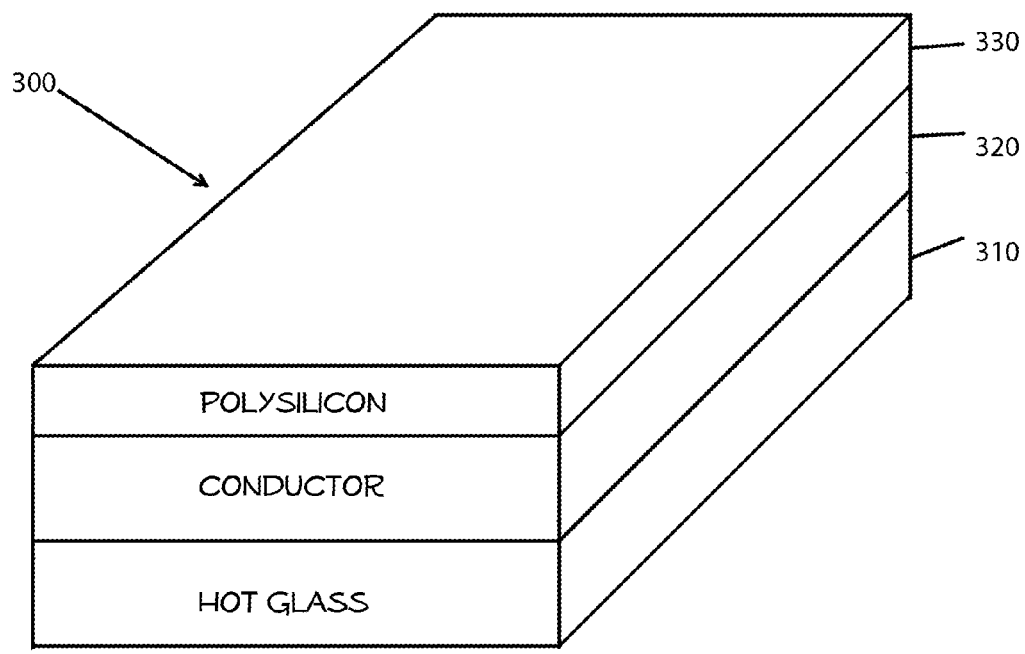
FIG. 3 is a cross-sectional diagram of another embodiment of high temperature thin film layer on glass (HTTFLOG) poly-silicon according to the present invention.

FIG. 3 is a cross-sectional diagram of another embodiment of the present invention, HTTFLOG 300. HTTFLOG 300 has a substrate layer 310 providing a base structure for the device. Substrate layer 310 may be glass during the Float Glass process while the glass is still hot. A thin layer of conductive material 320 such as Graphene overlays substrate 310, coating the hot glass substrate with about 1 to 500 nm of conductive material. An undoped or n-doped silicon layer 330 overlays the conductive layer 320.

Figure 4:
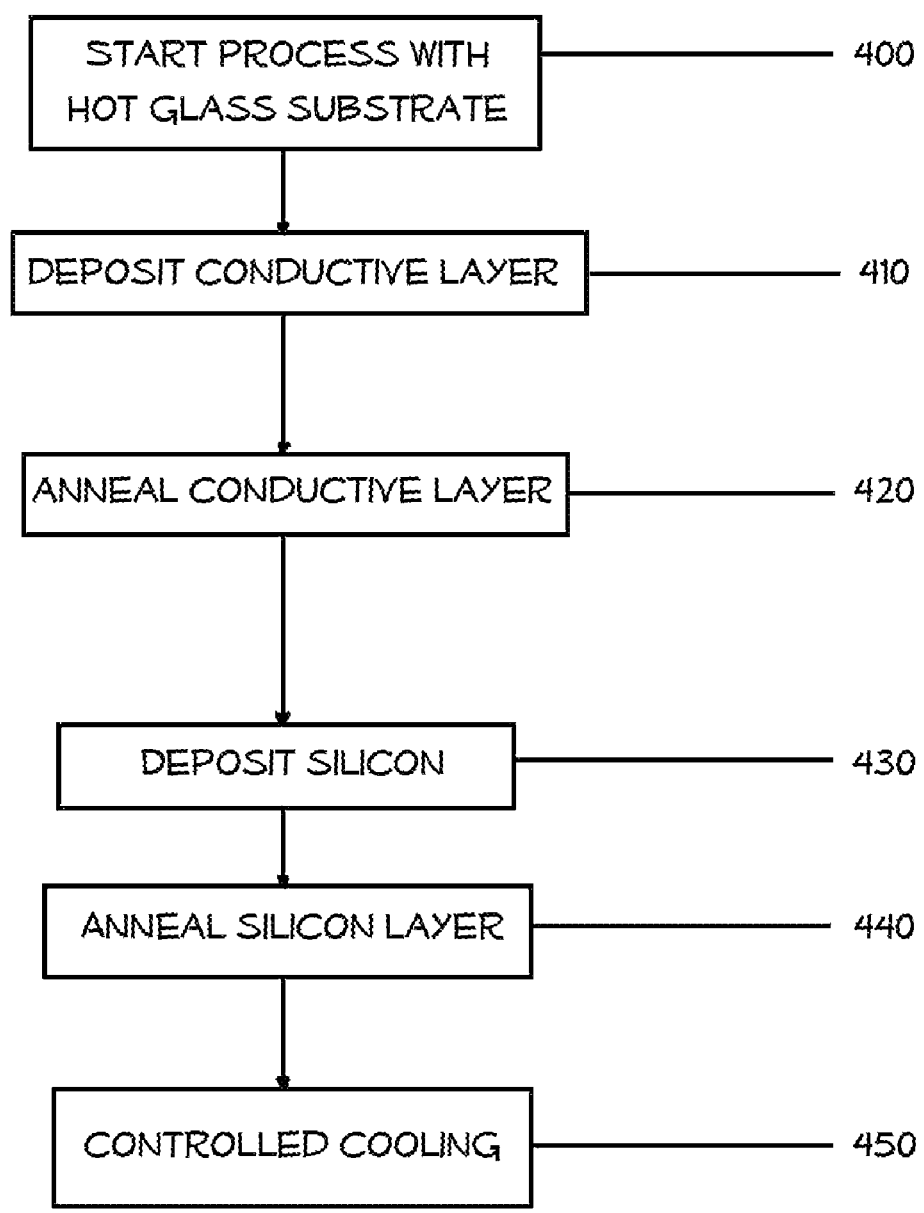
FIG. 4 is a flow diagram showing a method of fabricating high temperature thin film layer on glass (HTTFLOG) poly-silicon shown in FIG. 3 according to the present invention.

Referring to flow diagram FIG. 4, in step 400 a suitable substrate 310 is provided upon which HTTFLOG precursor structure 300 may be fabricated. In this embodiment the substrate is float glass, as in the first embodiment.

Step 410 forms a conductive layer 320 on top of substrate 310 by spraying or other deposition method. Conductive layer 320 is then annealed as necessary in step 420 using xenon flash lamps or other heat/energy source, or other lasers. A silicon layer 330 is formed by spraying or other deposition method overlaying the conductive layer 320 in step 430. Silicon layer 330 preferably has a thickness of about 5 nm to 1 micron in the specific embodiment. In step 440, the silicon layer 330 is annealed using rapid thermal annealing using xenon flash lamps or other heat/energy source, including other lasers, resulting in a polycrystalline structure. Step 450 provides controlled cooling of the poly-silicon structure created by step 440 in order to form the optimum crystalline structure. A protective layer may be applied to the HTTFLOG component during or following cooling in order to protect the surface until the component undergoes further processing.

Another embodiment of this invention is to add a layer of conductive material overlaying the silicon layer 330. Annealing is performed after each of the silicon and the conductive layers is deposited as necessary, followed by controlled cooling. The resulting structure is optionally patterned. A protective layer may be applied to the HTTFLOG component following any optional patterning in order to protect the surface until the component undergoes further processing.

While specific embodiments are described herein, it will be recognized that the present invention is not limited to the specific embodiment described. For example, in this embodiment n-doped silicon may be used or substituted with p-doped materials as suits the application needs. The concentration of dopant is such that is commonly used for producing electronic devices, including TFT devices or solar devices. Likewise, undoped silicon may be used in applications where subsequent ion implantation or comparable methods are being employed. Also, different or new fabrication techniques may be used or other changes made that do not depart from the spirit and scope of the present invention. The invention is intended to be limited only by the attached claims.

In the foregoing embodiments many of the elements have been described as separate devices or components for purposes of illustration. Such components may be integrated into a fewer number of components or divided into a larger number of components. Additionally, certain operations described as performed by a specific component may be performed by other components.

The foregoing description of the embodiments has been presented for the purposes of illustration and description. It is not intended to be exhaustive or to limit the embodiments to the precise form disclosed. Many modifications and variations are possible in light of the above teaching.

What is claimed is:

1. A method of fabricating a high temperature thin film poly-silicon layer on glass (HTTFLOG) that incorporates the fabrication of said layer into the Float Glass or other high temperature glass manufacturing process comprising:
   a) starting with a hot glass substrate during the Float Glass or similar hot glass continuous flow process above 500° C.;
   b) then an optional barrier layer is deposited overlying the substrate;
   c) then a thin layer of doped or undoped silicon is deposited overlying the prior layer or substrate;
   d) then the layer of step c) is annealed via a combination of existing substrate heat and Flash Lamp or other heat/energy source;
   e) then cooling of the layer of step c) is controlled to form a large grained thin film poly-crystalline structure;
   f) then if the deposited silicon was undoped, dopant can optionally be added via ion implantation or other method.

2. The HTTFLOG component according to claim 1, wherein the layers are patterned during or following fabrication by means of laser photo-ablation or other method.

3. The HTTFLOG component according to claim 1, wherein a protective layer is applied following step f during or following cooling to protect the surface until the component undergoes further processing.

4. A method of fabricating a high temperature thin film poly-silicon layer on glass (HTTFLOG) that incorporates the fabrication of said layer into the Float Glass or other high temperature glass manufacturing process comprising:
   a) starting with a hot glass substrate during the Float Glass or similar hot glass continuous flow process above 500° C.;
   b) then a thin layer of conductive material is deposited, and annealed as necessary, forming a first conductive layer overlying the glass substrate;
   c) then a thin layer of doped or undoped silicon is deposited overlying the conductive layer;
   d) then the layer of step c) is annealed via a combination of existing substrate heat and Flash Lamp or other heat/energy source;
   e) then cooling of the layer of step c) is controlled to form a large grained thin film poly-crystalline structure;
   f) then if the deposited silicon was undoped, dopant can optionally be added via ion implantation or other method.

5. The HTTFLOG component according to claim 4, wherein the layers are patterned during or following cooling by means of laser photo-ablation or other method.

6. The HTTFLOG component according to claim 4, wherein a protective layer is applied following step f during or following cooling to protect the surface until the component undergoes further processing.

* * * * *